United States Patent

Chikai et al.

[11] Patent Number: 5,808,504
[45] Date of Patent: Sep. 15, 1998

[54] INSULATED GATE TRANSISTOR DRIVE CIRCUIT

[75] Inventors: Satoru Chikai; Haruyoshi Mori; Tomohiro Kobayashi, all of Tokyo, Japan

[73] Assignee: Mitsubishi Denki Kabushiki Kaisha, Tokyo, Japan

[21] Appl. No.: 689,834

[22] Filed: Aug. 14, 1996

[30] Foreign Application Priority Data

Aug. 25, 1995 [JP] Japan .................................. 7-217191

[51] Int. Cl.⁶ .......................... H03K 17/08; H03K 17/28
[52] U.S. Cl. ........................ 327/434; 327/427; 327/380
[58] Field of Search ................................... 327/432, 434, 327/435–437, 479, 480, 481, 374, 376, 377, 380–383, 389, 391; 361/86, 89, 91, 56

[56] References Cited

U.S. PATENT DOCUMENTS

| | | | |
|---|---|---|---|
| 4,719,531 | 1/1988 | Okado et al. | 361/86 |
| 4,928,053 | 5/1990 | Sicard et al. | 323/284 |
| 5,055,721 | 10/1991 | Majumdar et al. | 327/434 |
| 5,061,863 | 10/1991 | Mori et al. | 327/50 |
| 5,173,848 | 12/1992 | Roof | 363/56 |
| 5,287,023 | 2/1994 | Miyasaka | 327/389 |
| 5,396,117 | 3/1995 | Housen et al. | 327/434 |
| 5,500,619 | 3/1996 | Miyasaka | 327/480 |

FOREIGN PATENT DOCUMENTS

| | | | |
|---|---|---|---|
| 0631390 | 12/1994 | European Pat. Off. | |
| 58-164323 | 9/1983 | Japan | 327/389 |
| 58-178632 | 10/1983 | Japan | 327/389 |
| 63-95728 | 4/1988 | Japan . | |
| 4-167813 | 6/1992 | Japan | 327/434 |
| 6 24393 | 3/1994 | Japan . | |
| 6-132800 | 5/1994 | Japan | 327/479 |
| 6296362 | 10/1994 | Japan . | |
| 7147726 | 6/1995 | Japan . | |
| 7297358 | 11/1995 | Japan . | |
| 2279524 | 1/1995 | United Kingdom | 327/374 |

*Primary Examiner*—Timothy P. Callahan
*Assistant Examiner*—T. T. Lam
*Attorney, Agent, or Firm*—Leydig, Voit & Mayer, Ltd.

[57] ABSTRACT

The cutoff process of a collector current of an insulated gate transistor is divided into an emitter-to-collector voltage recovery period and a collector current cutoff period. During the emitter-to-collector voltage recovery period the resistance of a gate resistor of the transistor is reduced, and during the collector current cutoff period the resistance of the gate resistor is increased. With this arrangement, the cutoff time is shortened, thereby reducing switching loss and suppressing surge voltage.

9 Claims, 11 Drawing Sheets

INSULATED GATE TRANSISTOR DRIVE CIRCUIT

BACKGROUND OF THE INVENTION

1. Field of the Invention

The present invention relates to an insulated gate transistor drive circuit, and more particularly to an improved insulated gate transistor drive circuit for reducing a voltage surge and switching loss during cutoff when used in an inverter circuit.

2. Description of Related Art

A great number of power switching circuits using insulated gate transistors have been proposed. Among insulated gate transistors, there are insulated gate bipolar transistors (hereinafter referred to as IGBTs) which have an insulated gate and operate in the bipolar mode, insulated gate field-effect transistors which have an insulated gate and operate in the field-effect mode, and metal oxide semiconductor field-effect transistors.

A chopper circuit described in Japanese Patent Publication No. 5-31323 is shown in FIG. 18 as an example of a gate drive circuit.

In FIG. 18, an IGBT 1 has a gate (G), an emitter (E), a collector (C), a collector-to-gate capacitance ($C_{CG}$), and a gate-to-emitter capacitance ($C_{GE}$). A first switching element 2 conducts to make the IGBT 1 conduct and applies a positive voltage to the gate G, whereas a second switching element 3 conducts to cut the IGBT 1 and causes a voltage applied to the gate G to be zero. Reference numeral 4 denotes a gate resistor which determines the charging-discharging constant of the gate G. Reference numeral 20 denotes a DC voltage source whose voltage is $V_D$. Reference numerals 21 and 22 denote a diode and a load device. The wiring inductance of the load circuit is represented by reference character L. Reference numeral 23 is a control-signal generating circuit which generates a control signal and 24 is the voltage source for the drive circuit.

In the IGBT 1, the collector and the emitter are electrically connected when a positive voltage is applied between the gate and the emitter and the collector and the emitter are electrically disconnected when a positive voltage is applied between the gate and the emitter becomes less than a threshold level $V_{TH}$.

Now, the operation will be described.

If the switching element 2 is conducting and the switching element 3 is cut off by the control signal from the control-signal generating circuit 23, a positive voltage will be applied to the gate G through the gate resistor 4 and the IGBT 1 will conduct. The collector current $I_C$ flows from the DC voltage source 20 to the load 22. Then, if the conduction and cutoff of the switching elements 2 and 3 are inverted, the voltage applied to the gate G will be attenuated. If the voltage at the gate G becomes less than the threshold level $V_{TH}$, the collector current $I_C$ will be cut off and the current being passed through the load 22 will return through the diode 21. The voltage and current waveforms at each part during the cutoff operation of the IGBT 1 are shown in FIG. 19.

In FIG. 19, $V_S$ represents the voltage at the connection point between the switching elements 2 and 3, $V_{GE}$ is the gate-to-emitter voltage, $V_{CE}$ is the collector-to-emitter voltage, and $I_C$ is the collector current. Also, the product of the collector current $I_C$ and the collector-to-emitter voltage $V_{CE}$ is represented by $P_{CE}$. The area of $P_{CE}$ corresponds to the switching loss during the cutoff operation.

If at time $T_1$ the voltage $V_S$ at the connection point between the switching elements 2 and 3 becomes zero, then the electrical charges stored in the gate-to-emitter capacitance $C_{GE}$ will be discharged through the gate resistor 4 and the gate-to-emitter voltage $V_{GE}$ will be attenuated. If at time $T_2$ the gate-to-emitter voltage $V_{GE}$ reaches a certain voltage level characteristic to the IGBT 1, the collector-to-emitter voltage $V_{CE}$ will begin to rise. Because the rise in this voltage causes current to flow to the gate G through the collector-to-gate capacitance $C_{CG}$, a reduction in the gate-to-emitter voltage $V_{GE}$ is suppressed until the time $T_S$ at which the collector-to-emitter voltage $V_{CE}$ equals the source voltage $V_D$. If the collector-to-emitter voltage $V_{CE}$ becomes greater than the source voltage $V_D$, the gate-to-emitter voltage will again begin to decrease and at the same time the collector current $I_C$ will also begin to decrease. The collector-to-emitter voltage $V_{CE}$ becomes greater than the source voltage by $L \cdot dI_C/dt$, which corresponds to the product of the wiring inductance L and the rate of change of the collector current $I_C$. If at time $T_4$ the gate-to-emitter voltage $V_{GE}$ is attenuated down to the threshold level $V_{TH}$, the collector current $I_C$ will be cut off.

To make efficient use of the ability of the IGBT 1, it is necessary to use the IGBT 1 at a higher source voltage and reduce the loss of the element including a switching loss. To use the IGBT 1 at a higher source voltage, the surge voltage $\Delta V_{CE}$ which occurs at the time of switching must be made small so that the voltage which is applied to the IGBT never exceeds its withstand voltage. In the IGBT the rate of change of the collector current at the time of cutoff can be made small by making the resistance value $r_G$ of the gate resistor 4 large. However, if the resistance value $r_G$ of the gate resistor 4 is made large to make the rate of change of the collector current small, the time needed for cutting off the collector current $I_C$ will become longer and so the problem will arise that the switching loss will be increased.

As a means of overcoming a problem such as this, a structure shown in FIG. 20 is described in Japanese Utility Model Laid-Open No. 6-24393.

The structure has a gate resistor 4 comprising a group of serially connected resistors $4_a$, $4_b$ and $4_c$, a switch group 5 comprising switches $5_a$, $5_b$ and $5_c$ connected so that both ends of each of the resistors $4_a$, $4_b$ and $4_c$ are short-circuited, a current detector 25 for detecting a current which passes through an IGBT 1, and means 26 for controlling the switch group 5, based on the current passing through the IGBT 1. In this connection, it is to be noted that reference numeral 23' is a control unit which has the functions of the control-signal generating circuit 23, the switching elements 2 and 3, and the drive-circuit voltage source 24, shown in FIG. 18.

The switching loss during the cutoff operation is usually suppressed by closing one of the switches $5_a$, $5_b$ and $5_c$ to make the resistance value of the gate resistor 4 small. However, if the current $I_C$ becomes greater than a certain value, the rate of change of the collector current $I_C$ during the cutoff operation is made small and the surge voltage $V_{CE}$ is suppressed, by increasing the resistance value of the gate resistor 4.

With the conventional IGBT drive circuit constructed as described above, when the surge voltage is suppressed, the resistance value of the gate resistor needs to be increased if the collector current is large and there is the problem that the switching loss will necessarily be increased.

SUMMARY OF THE INVENTION

An object of the present invention is to eliminate the aforementioned problems and provide an IGBT drive circuit which is capable of reducing switching loss, and suppressing a surge voltage during cutting off the collector current in comparison with the conventional IGBT drive circuit.

An IGBT drive circuit according to the present invention comprises operation-state detecting means for applying a gate signal which controls the conduction and cutoff of an insulated gate transistor to a gate of said insulated gate transistor through a gate resistor circuit thereby to detect a state of operation of said insulated gate transistor, and operational parameter adjusting means for adjusting an operational parameter of said insulated gate transistor in a process of cutting off a collector current of said insulated gate transistor, based on the state of operation detected by said operation-state detecting means.

With this arrangement, the cutoff time of the insulated gate transistor can be shortened, and a switching loss and a surge voltage can be suppressed.

The operation-state detecting means detects the collector current of the insulated gate transistor or a collector-to-emitter voltage of the insulated gate transistor.

The operational parameter is a resistance value of the gate resistor circuit, a gate-to-emitter capacitance of the insulated gate transistor, or a gate voltage of the insulated gate transistor.

In a more concrete IGBT circuit, the operational parameter is adjusted based on a result of comparison between the collector-to-emitter voltage of the insulated gate transistor and a reference voltage. The reference voltage may be a constant value or a steady-state collector-to-emitter voltage in the cutoff state of the insulated gate transistor. Furthermore, the reference voltage may be adjusted.

BRIEF DESCRIPTION OF THE DRAWINGS

The above and other objects and advantages of the present invention will become apparent from the following detailed description when read in conjunction with the drawings.

DETAILED DESCRIPTION OF THE PREFERRED EMBODIMENTS

Figure 1:
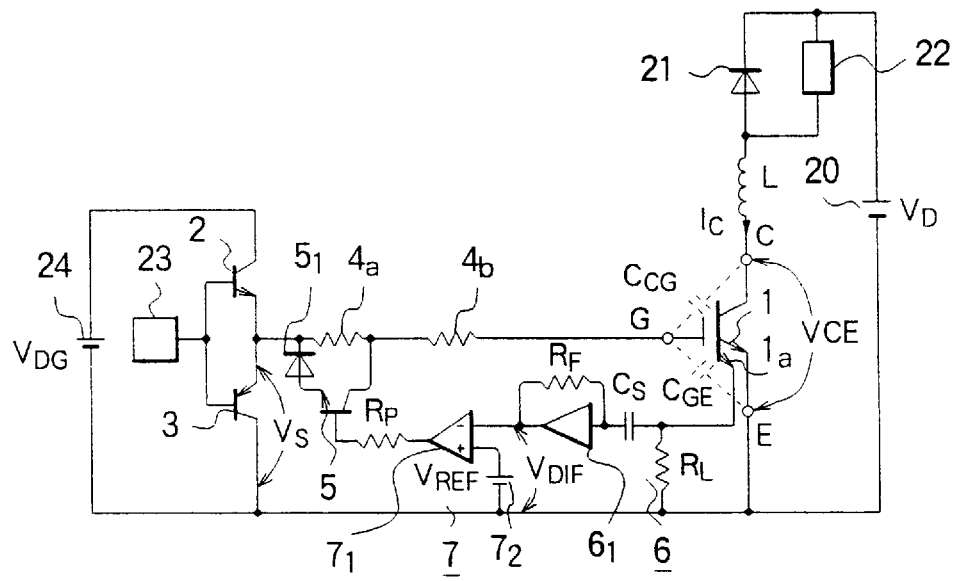
FIG. 1 is a block diagram of an IGBT drive circuit of a first embodiment of the present invention.

In the following explanation of preferred embodiments of the present invention, the same reference numerals and characters will be applied to parts identical or corresponding to those in the preceding description and so repeated description is omitted.

First Embodiment

Figure 2:
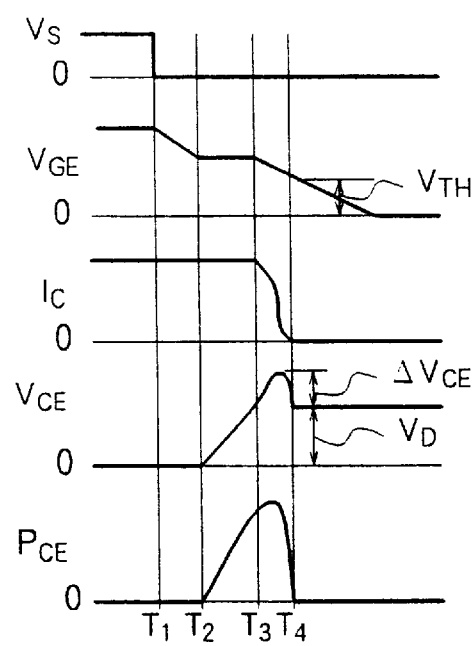
FIG. 2 is a voltage and current waveform diagram of each part in the IGBT drive circuit of the first embodiment of the present invention.

An IGBT drive circuit according to a first embodiment of the present invention is shown in FIG. 1 and the voltage and current waveforms in each part during a cutoff operation are shown in FIG. 2.

The IGBT 1 has a current sensor device 1, incorporated therein and outputs a current signal proportional to a collector current $I_C$. Reference numerals $4_a$ and $4_b$ denote gate resistors. Reference numeral 5 denotes a gate resistor switching element, and reference numeral $5_1$ denotes a protective base reverse bias diode for the gate resistor switching element 5. Reference numeral 6 represents a differentiating circuit which comprises an operational amplifier $6_1$, resistors $R_L$ and $R_F$, and a capacitor $C_S$, and outputs a signal corresponding to a differentiated value of the collector current $I_C$. A comparator 7 comprises an operational amplifier $7_1$, a reference voltage source $7_2$, and a resistor $R_P$. The comparator 7 compares the output of the differentiating circuit 6 with a reference voltage $V_{REF}$, and outputs a high level when the output of the differentiating circuit 6 is less than the reference voltage $V_{REF}$. The gate resistor switching element 5 conducts and short-circuits the gate resistor $4_a$ when the logic level of the output signal of the comparator 7 is high.

In the IGBT drive circuit constructed as described above, the change rate of the collector current $I_C$ is small in a period between (1) the time $T_1$ at which the switching element 3 becomes conductive, reducing voltage $V_S$ to zero so that the charge stored in the gate-to-emitter capacitance $C_{GE}$ begins to be discharged, and (2) the time $T_2$ at which the collector-to-emitter voltage $V_{CE}$ begins to rise. Therefore, between time $T_1$ and time $T_2$, the output voltage $V_{DIF}$ of the differentiating circuit 6 is less than the reference voltage $V_{REF}$ and the output of the comparator 7 goes to a high level, so the gate resistor switching element 5 conducts.

In the aforementioned state, both ends of the gate resistor $4_a$ are short-circuited and only the gate resistor $4_b$ is connected to the gate circuit. Therefore, the discharging constant of the charge stored in the gate-to-emitter capacitance $C_{GE}$ is small and the gate-to-emitter voltage $V_{GE}$ attenuates quickly. Then, until the time $T_3$ when the collector-to-emitter voltage $V_{CE}$ begins to rise and the collector current $I_C$ begins to decrease, as with the period between time $T_1$ and time $T_2$, the rate of change of the collector current $I_C$ is small and the output of the comparator 6 holds a high level, so that the gate resistor switching element 5 remains conductive.

During this period, the following relation is established.

$$(V_{GE}-V_S)/r_G = C_{GE} \cdot dV_{CE}/dt$$

That is, if the gate resistor $r_G$ is large, then a rise in the collector-to-emitter voltage $V_{CE}$ will become slow, the period between time $T_2$ and time $T_3$ will be long, and the switching loss during this period will become large.

However, because, during the period between $T_2$ and $T_3$, the gate resistor switching element 5 is conductive as described above, the resistance of the gate circuit becomes only the resistance value of the gate resistor $4_b$, and the period between time $T_2$ and time $T_3$ is shortened in comparison with the conventional IGBT drive circuit.

If at time $T_3$ the collector-to-emitter voltage $V_{CE}$ becomes greater than the voltage source $V_D$, the collector current $I_C$ begins to decrease and therefore the rate of change becomes large. The output voltage $V_{DIF}$ of the differentiating circuit 6 also becomes large, and the output of the comparator 7 goes to a low (0) level and cuts off the gate resistor switching element 5. The gate resistors $4_a$ and $4_b$ are inserted in series into the gate circuit and the attenuating constant of the gate-to-collector voltage $V_{GE}$ becomes large. As a result, the rate of change of the collector current $I_C$ is suppressed and the surge voltage $V_{CE}$ is also suppressed. The maximum value of the surge voltage, $V_{CE}$, can be obtained by the following equation.

$$\Delta V_{CE} = L \cdot (dI_C/dt)_{max}$$

where $(dI_C/dt)_{max}$ represents the maximum value of $dI_C/dt$. Thus, in the process of cutting off the collector current $I_C$, the surge voltage $\Delta V_{CE}$ can be suppressed and furthermore the period where switching loss occurs can be shortened, so that it becomes possible to considerably suppress the switching loss.

Figure 3:
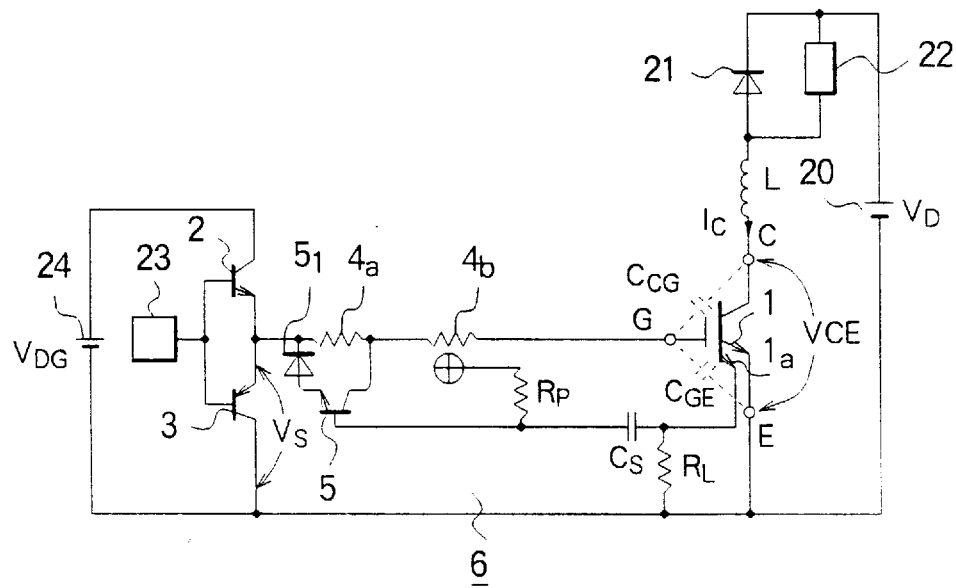
FIG. 3 is a block diagram of another IGBT drive circuit of the first embodiment of the present invention.

While it has been described that the differentiating circuit using the operational amplifier and the comparator is employed, an RC differentiating circuit can also be used as shown in FIG. 3.

The differentiating circuit 6 is constituted by a resistor $R_L$, a capacitor $C_S$, and a pull-up resistor $R_P$.

In the IGBT drive circuit constructed as described above, as with the embodiment of FIG. 2, between time $T_1$ and time $T_3$ the output voltage $V_{DIF}$ of the differentiating circuit 6 is held to a high level by the pull-up resistor $R_P$, and the gate resistor switching element 5 conducts and short-circuits the gate resistor $4_a$. Between time $T_3$ and time $T_4$, the output voltage $V_{DIF}$ of the differentiating circuit 6 decreases and cuts off the gate resistor switching element 5, and the same operation as FIG. 1 is performed.

If constructed in the aforementioned way, the IGBT becomes structurally simple and can be inexpensively realized.

While it has been described that the operational amplifier and the CR differentiating circuit are used as a means of controlling the gate resistor switching element 5, the present invention is not limited to these two cases. Important to the achievement of the object of the present invention is that the gate resistor switching element 5 is controlled based on the change rate of the collector current $I_C$.

Second Embodiment

Figure 4:
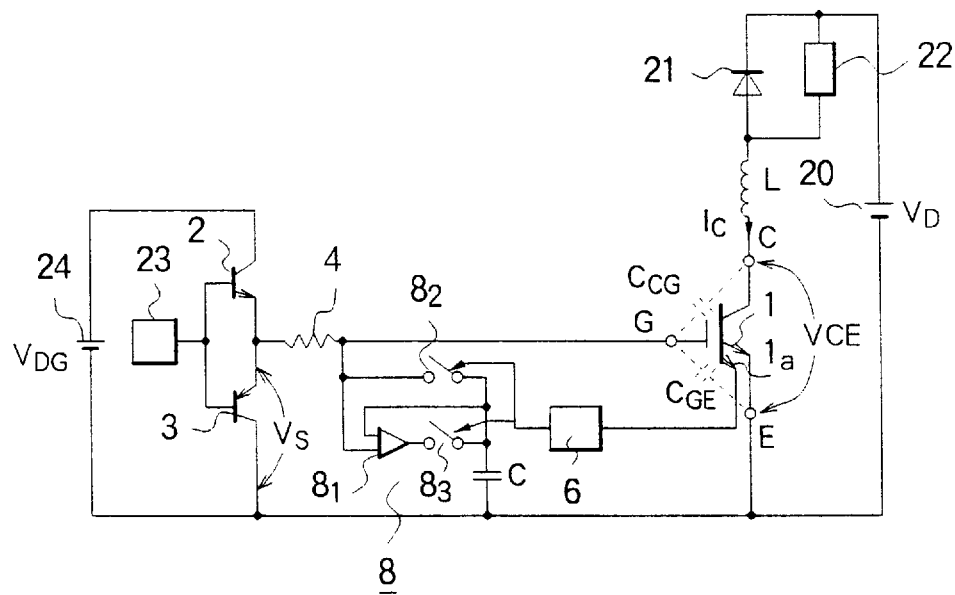
FIG. 4 is a block diagram of an IGBT drive circuit of a second embodiment of the present invention.

An IGBT drive circuit according to a second embodiment of the present invention is shown in FIG. 4.

Reference numeral 6 denotes a differentiating circuit block which generates a signal corresponding to the rate of change of a collector current $I_C$. Reference numeral 8 denotes a gate-to-emitter capacitance switching circuit, which is constituted by a comparator $8_1$, first and second change-over switches $8_2$ and $8_3$, and a capacitor (C). When there is no detection output of the differentiating circuit 6, the first change-over switch 82 is opened and the second change-over switch $8_3$ is closed.

In the IGBT drive circuit constructed as described above, the rate of change $dI_C/dt$ of the collector current $I_C$ is small in the first half of the process of cutting off the collector current $I_C$, that is, between time $T_1$ and $T_3$ in the first embodiment. Therefore the capacitor C has been charged. On the other hand, the charge stored in the gate-to-emitter capacitance $C_{GE}$ is discharged with the discharging constant which is determined by the resistance value $r_G$ of the gate resistor 4. Therefore, by suitably selecting the resistance value $r_G$, a desired discharging constant similar to the first embodiment can be obtained. If, in the second half of the cutoff process, that is, in the period after time $T_3$ in the first embodiment, the value of the collector-to-emitter voltage $V_{CE}$ is greater than that of the DC voltage $V_D$, the rate of change $dI_C/dt$ of the collector current $I_C$ becomes large, and the change-over switch $8_2$ is closed and the change-over switch $8_3$ is opened, by the detection output of the differentiating circuit 6. In this state, the gate-to-emitter capacitance $C_{GE}$ and the capacitor C are connected in parallel and discharging is performed through the gate resistor 4, so that the discharging constant becomes large as compared with the first half of the cutoff process. For this reason, by suitably selecting the resistance value $r_G$ of the gate resistor 4 and the capacitance of the capacitor C, a desired discharging constant similar to the first embodiment is obtainable. The rate of change of the collector current $I_C$ can be suppressed, and the surge voltage $V_{CE}$ due to the wiring inductance L can be suppressed to a desired value.

With the aforementioned arrangement, the gate resistance can be realized with a single resistor consuming a large amount of power, so that the IGBT drive circuit can be realized with higher reliability and at a low price.

For the change-over switches $8_2$ and $8_3$ being operated by the detection output of the differentiating circuit 6, mechanical switches have been illustrated and described for the purpose of a better understanding, but, in practice, electronic switch means are used. The same holds for the following description.

Third Embodiment

Figure 5:
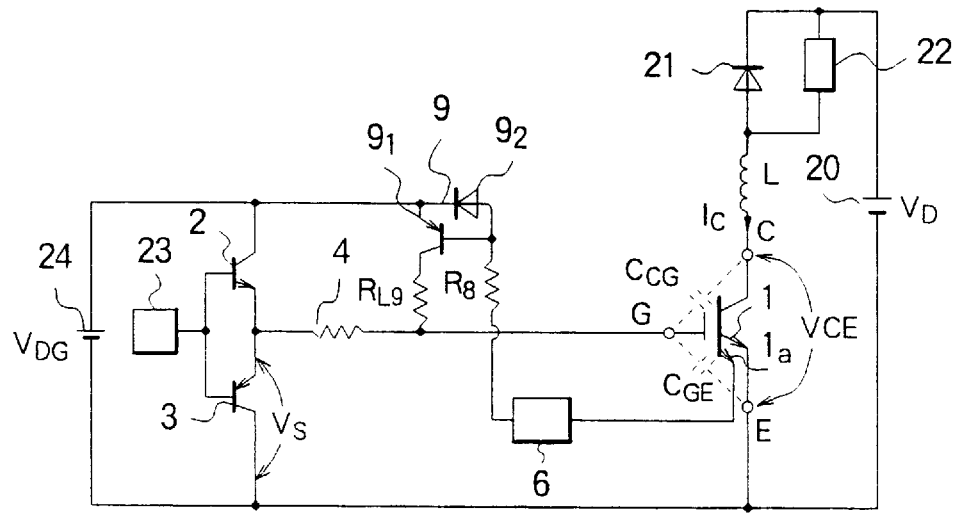
FIG. 5 is a block diagram of an IGBT drive circuit of a third embodiment of the present invention.
Figure 6:
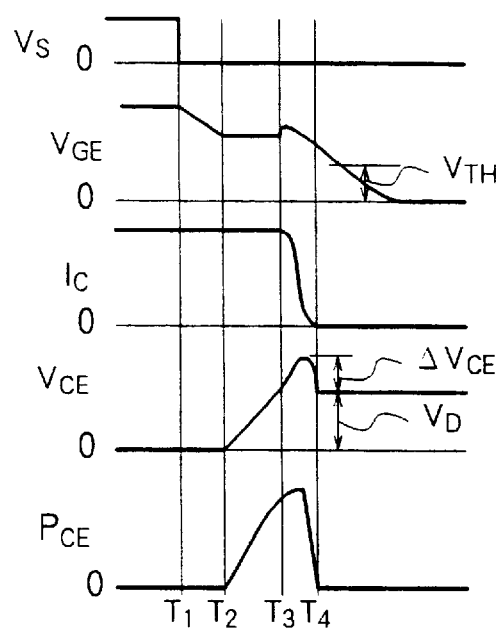
FIG. 6 is a voltage and current waveform diagram of each part in the IGBT drive circuit of the third embodiment of the present invention.

An IGBT drive circuit of a third embodiment according to the present invention is shown in FIG. 5, and the voltage and current waveforms in each part are shown in FIG. 6.

Reference numeral 6 denotes a differentiating circuit. Reference numeral 9 denotes a gate-voltage control circuit, which consists of a gate circuit switching element $9_1$, a protective base reverse bias diode $9_2$ for the gate circuit switching element $9_1$, a resistor $R_{L9}$, and a base resistor $R_B$ for the gate circuit switching element $9_1$.

In the IGBT drive circuit constructed as described above, between time $T_2$ and $T_3$ the charge stored in the gate-to-emitter capacitance $C_{GE}$ is discharged with the discharging constant which is determined by the resistance value of the gate resistor 4. Therefore, by suitably selecting the resistance value of the gate resistor 4, a desired discharging constant similar to the first embodiment can be obtained.

Also, between $T_3$ and $T_4$, the rate of change of $dI_C/dt$ of the collector current $I_C$ becomes large, so the output of the differentiating circuit 6 goes to a low level and forward biasing is applied between the base and the emitter of the gate circuit switching element $9_1$. Therefore, the gate circuit switching element $9_1$ conducts and, from the ratio of the voltage on the resistor $R_{L9}$ to the voltage on the gate resistor 4, the gate potential can be enhanced. Therefore, by suitably selecting the resistance of the resistor $R_{L9}$ with respect to the resistance of the gate resistor 4, the period between time $T_3$ and time $T_4$ can be set to a desired time.

With the aforementioned arrangement, as with the IGBT drive circuit according to the first embodiment of the present invention, the gate resistance can be a single resistor with a large power consumption. In addition, the IGBT drive circuit becomes structurally simple and can be realized with higher reliability and at a low price.

Fourth Embodiment

Figure 7:
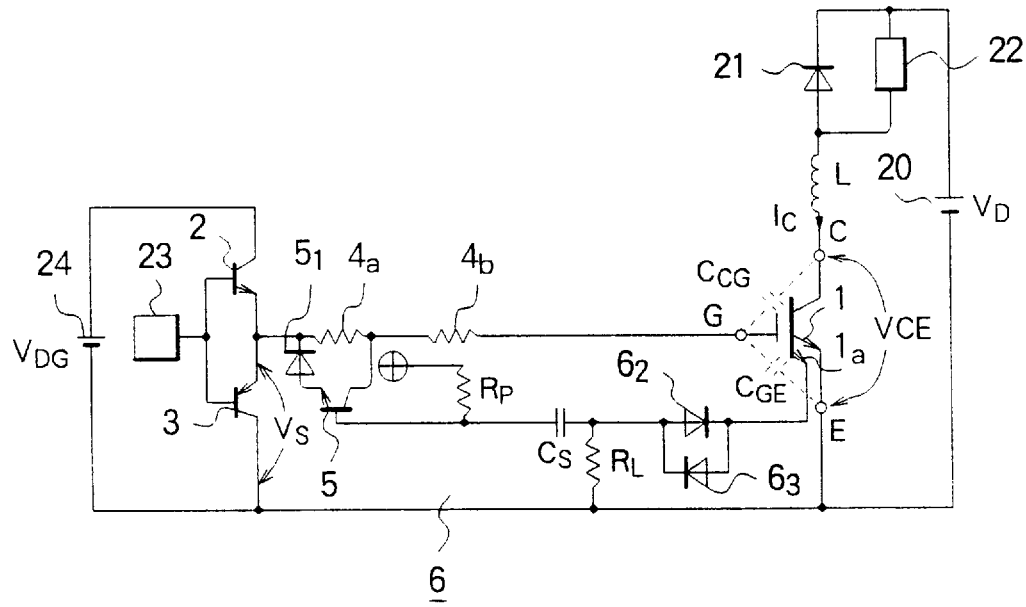
FIG. 7 is a block diagram of an IGBT drive circuit of a fourth embodiment of the present invention.
Figure 8:
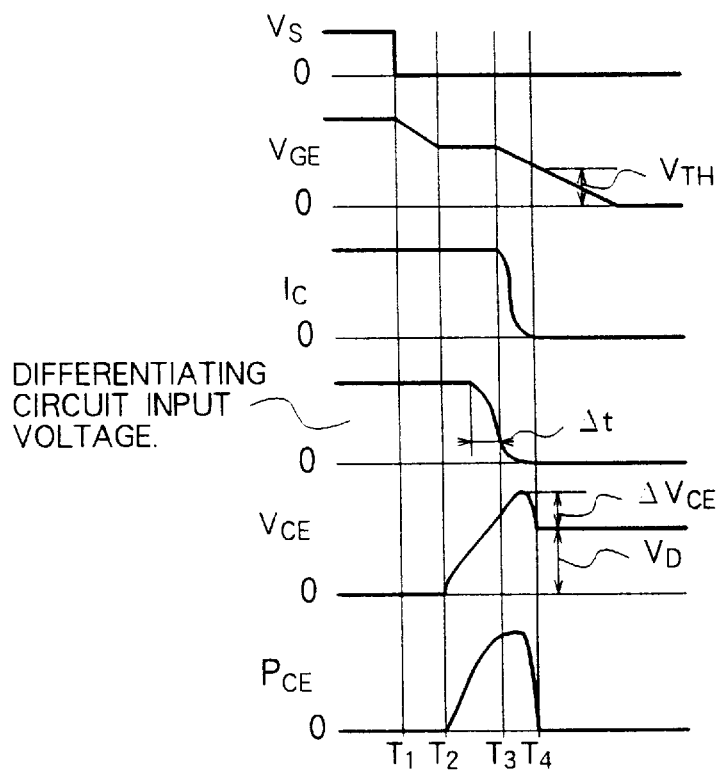
FIG. 8 is a voltage and current waveform diagram of each part in the IGBT drive circuit of the fourth embodiment of the present invention.
Figure 9:
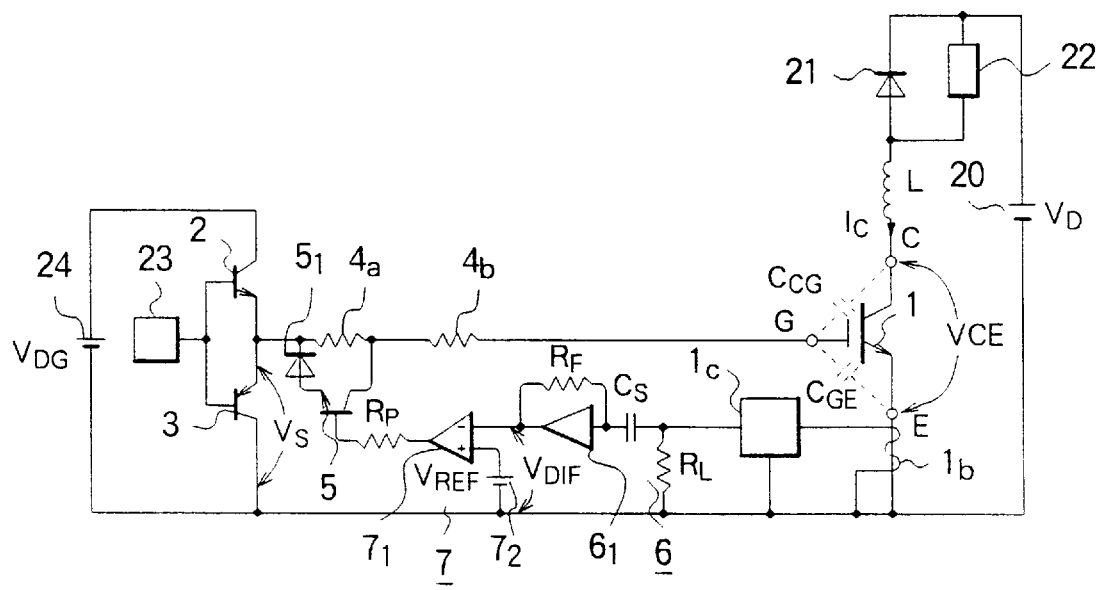
FIG. 9 is a block diagram of another IGBT drive circuit of the fourth embodiment of the present invention.

An IGBT drive circuit according to a fourth embodiment of the present invention is shown in FIG. 7, and the voltage and current waveforms in each part are shown in FIG. 8.

In the fourth embodiment, diodes $6_2$ and $6_3$ are connected in reverse parallel between the current sensor device $1_a$ and the differentiating circuit 6 of the IGBT drive circuit shown in FIG. 3.

During the cutoff operation of the IGBT 1, the diodes $6_2$ and $6_3$ have the following influence on a current passing through the current sensor device $1_a$.

If, between time $T_3$ and time $T_4$, the collector-to-emitter voltage $V_{CE}$ rises, the collector current $I_C$ begins to decrease, but a bias is added by the amount of the forward voltage drop of the diodes $6_2$ and $6_3$, apparently a reduction in the collector current occurs early. Because this means that the change rate $dI_C/dt$ of the collector current $I_C$ is detected early by a short time $\Delta t$, a signal is output to the secondary gate resistor switching element 5 earlier by the time $\Delta t$ than the time when collector current $I_C$ changes. Therefore, an initial surge voltage at which the collector current $I_C$ begins to change sharply can be suppressed.

The conception of this embodiment can be applied to all of the aforementioned first, second, and third embodiments.

In the aforementioned first, second, third, and fourth embodiments, the current sensor device $1_a$ has been incorporated into the IGBT4. However, instead of the current sensor device $1_a$, a combination of a collector current detector $1_b$ and an amplifier $1_c$ provided separately from the IGBT can be used. The arrangement can make it unnecessary to incorporate the current sensor device into the IGBT. Furthermore, because the degree of freedom of the setting of a ratio between the collector current $I_C$ and the detected current increases, the degree of freedom of selection of elements increases.

Fifth Embodiment

In the aforementioned first, second, third, and fourth embodiments, the collector current of the IGBT has been detected and, based on the rate of change, the operation of the gate resistor circuit has been switched so that switching loss and surge voltage can be suppressed. However, based on the collector-to-emitter voltage of the IGBT, the operation of the gate resistor circuit may be switched so that switching loss and surge voltage can be suppressed.

Figure 10:
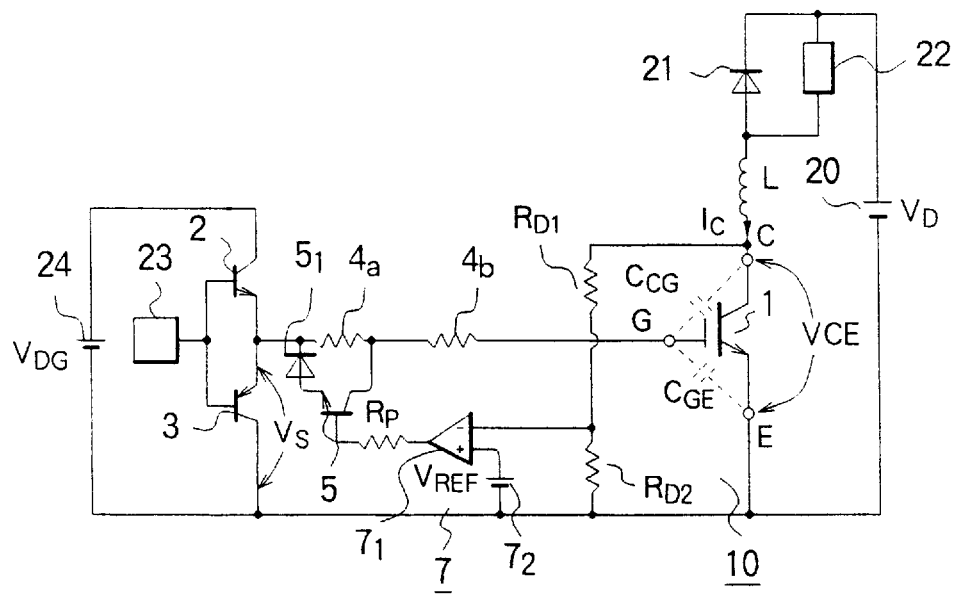
FIG. 10 is a block diagram of an IGBT drive circuit of a fifth embodiment of the present invention.

An IGBT drive circuit according to a fifth embodiment of the present invention is shown in FIG. 10.

A collector-to-emitter voltage detecting circuit 10 comprises voltage dividing resistors $R_{D1}$ and $R_{D2}$. The divided voltage, detected by the circuit 10, is compared with a reference voltage $V_{REF}$ at a comparator 7 to conduct or cut off a gate resistor switching element 5 and switch a gate resistor. This embodiment is identical in operation to the first embodiment shown in FIG. 1, except that the gate resistor circuit is switched based on the collector-to-emitter voltage $V_{CE}$. However, by appropriately selecting the ratio of voltages divided by the voltage dividing resistors $R_{D1}$ and $R_{D2}$ and/or the reference voltage $V_{REF}$, it is possible to switch the gate resistor at the time the collector-to-emitter voltage $V_{CE}$ has reached an arbitrary value. Because the circuit construction is simple and no differentiating circuit is used, reliability is high with respect to noise.

Figure 11:
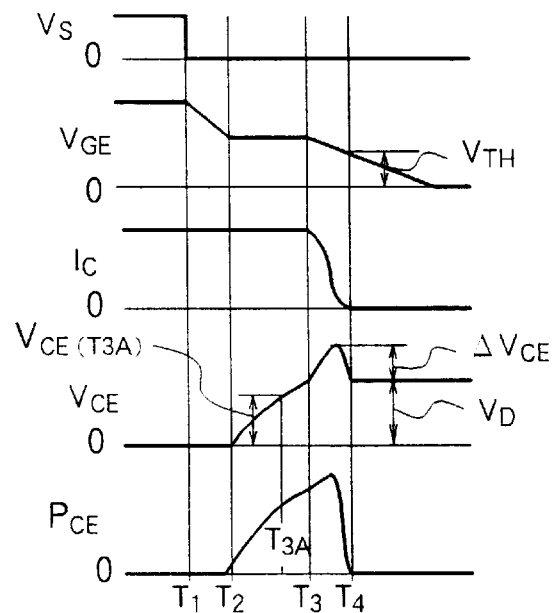
FIG. 11 is a voltage and current waveform diagram of each part in the IGBT drive circuit of the fifth embodiment of the present invention.

FIG. 11 shows an example of the voltage and current waveforms of each part in the fifth embodiment.

If the collector-to-emitter voltage at gate-resistor switching time $T_{3A}$ is taken to be $V_{CE\ (T3A)}$, a reference voltage can be expressed as follows.

$$V_{CE\ (T3A)} = (r_{D1} + r_{D2}) \cdot V_{REF}/r_{D2}$$

where $r_{D1}$ and $r_{D2}$ represent the resistance values of the voltage dividing resistors $R_{D1}$ and $R_{D2}$.

Figure 12:
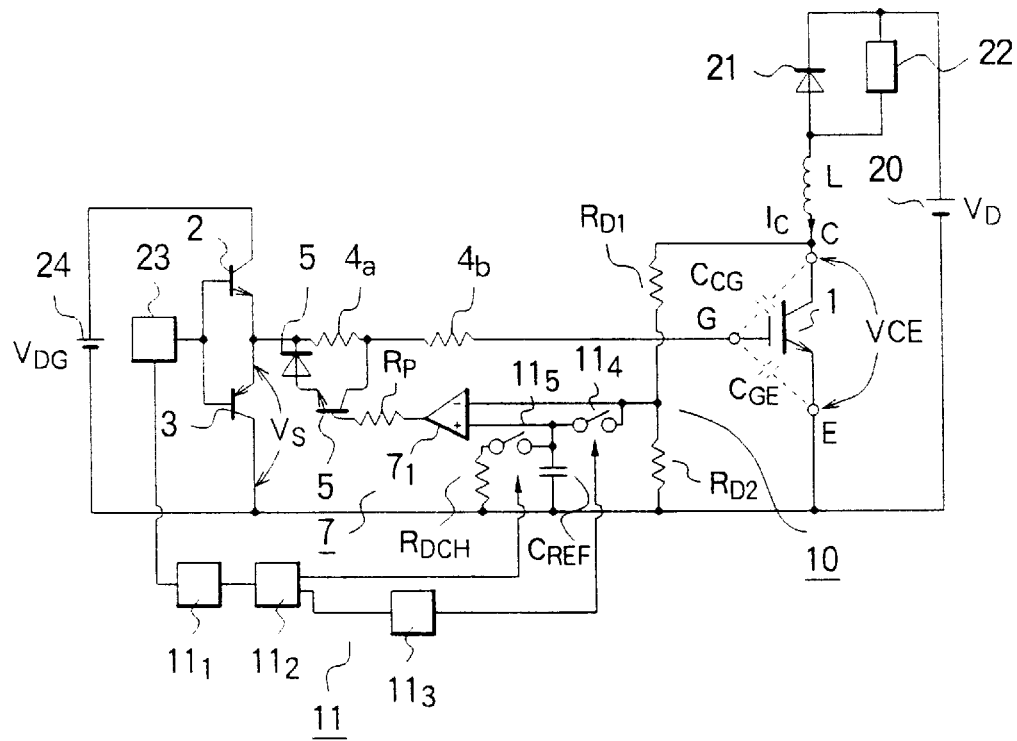
FIG. 12 is a block diagram of another IGBT drive circuit of the fifth embodiment of the present invention.

An IGBT drive circuit shown in FIG. 12 is a modification of the IGBT drive circuit described with FIG. 10. Even when the voltage of a voltage source varies, surge voltage and switching loss can be suppressed reliably.

The IGBT drive circuit of FIG. 12 is constructed such that a steady-state collector-to-emitter voltage signal in a cutoff period, followed by the collector current cutoff of an IGBT 1, is used as the reference voltage $V_{REF}$ of FIG. 10.

Reference numeral 11 denotes steady-state voltage input means, which comprises a delay circuit $11_1$, a first one-shot circuit $11_2$, a second one-shot circuit $11_3$, a capacitor $C_{REF}$, a voltage input switch $11_4$, a discharge switch $11_5$, and a discharge resistor $R_{DCH}$.

Figure 13:
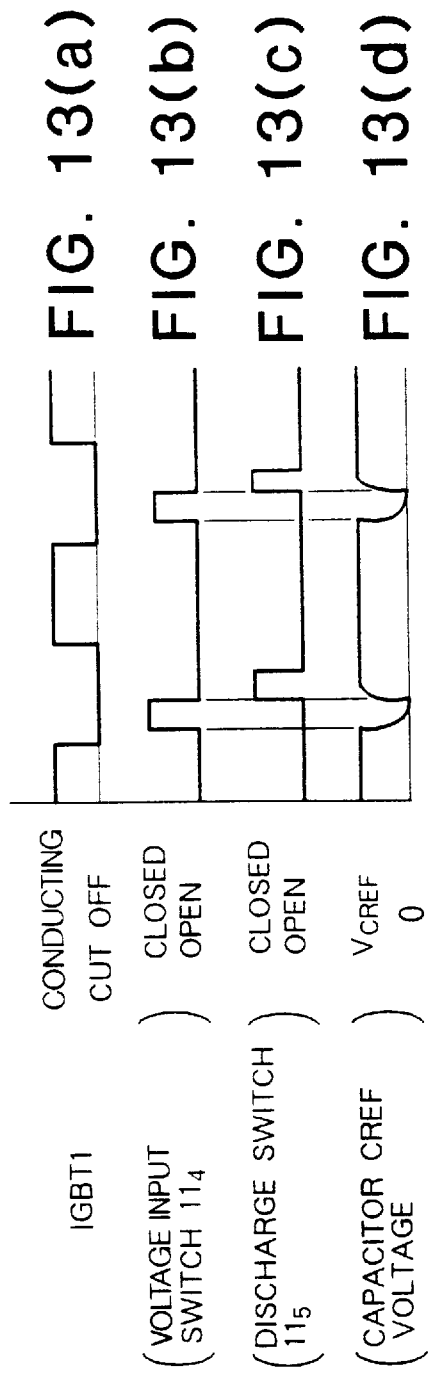
FIG. 13 is a timing chart of the state of operation in FIG. 12.

FIG. 13 is a timing chart of the operation of the steady-state voltage input means 11.

At a time delayed by an amount of the set time of the delay circuit $11_1$ from the time when a control-signal generating circuit 23 generates a cutoff signal, the first one-shot circuit $11_2$ is operated, and the discharge switch $11_5$ is closed for a predetermined period of time. Also, the charge stored in the capacitor $C_{REF}$ is discharged through the discharge resistor $R_{DCH}$. After the discharge switch $11_5$ is opened, the second one-shot circuit $11_2$ is operated, and the voltage input switch $11_4$ is closed for a predetermined period of time, so that the steady-state collector-to-emitter voltage signal of the IGBT 1 divided by the voltage divider resistors $R_{D1}$ and $R_{D2}$ is input to the capacitor $C_{REF}$.

The voltage $V_{CREF}$ that is obtained by the capacitor $C_{REF}$ can be calculated as follows.

$$V_{CREF} = VD \cdot r_{D1}/(r_{D1} + r_{D2})$$

FIG. 13 is a timing chart showing how the voltage input switch $11_4$, the discharge switch $11_5$, and the capacitor $C_{REF}$ are operated.

It has been described that the delay circuit $11_1$ and the first and second one-shot circuits $11_2$ and $11_3$ are used for applying the voltage source signal to the capacitor $C_{REF}$, based on the cutoff signal of the control-signal generating circuit 23. However, in a case where the cycle of the signal from the control-signal generating circuit 23 varies, a problem arises in the above arrangement.

The object of the present invention is that the steady-state collector-to-emitter voltage signal in a cutoff period, followed by the collector current cutoff process of the IGBT 1, is used as the reference voltage $V_{REF}$ of the comparator 7 in order to reliably suppress the surge voltage and switching loss even when the voltage of the voltage source varies. Therefore, in the aforementioned case, the operation signal synchronized with the IGBT control signal is generated by the control-signal generating circuit 23, and the voltage input switch $11_4$ and the discharge switch $11_5$ are switched so that the steady-state collector-to-emitter voltage signal in a cutoff period, followed by the collector current cutoff process of the IGBT 1, is taken into the capacitor $C_{REF}$.

Figure 14:
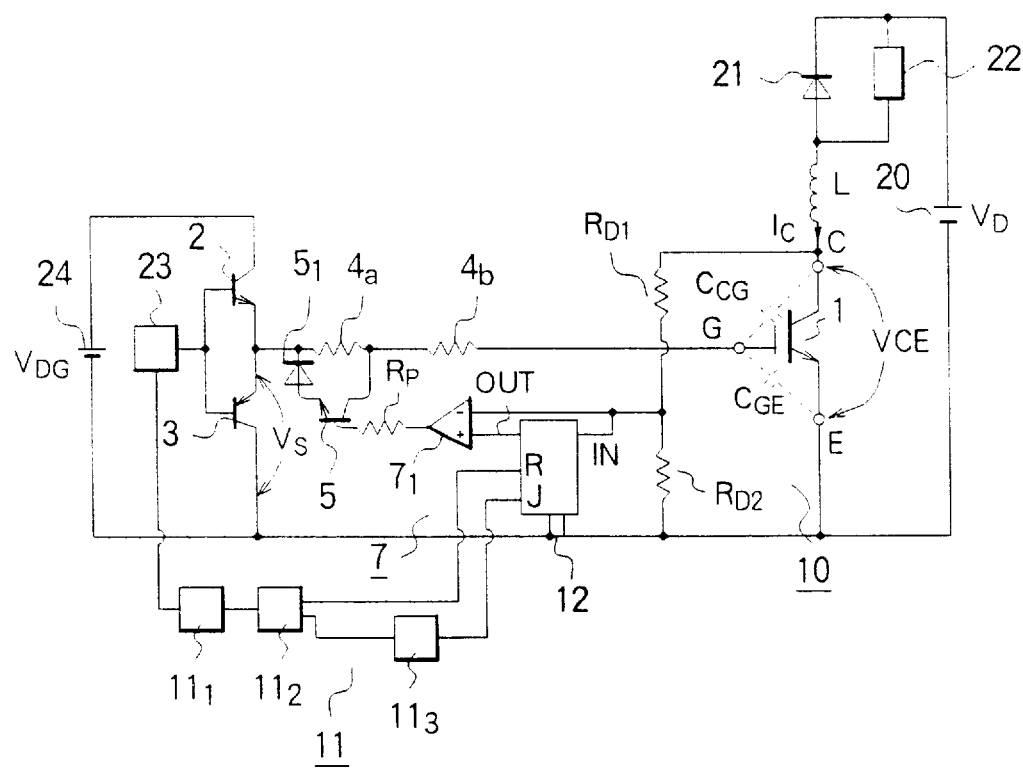
FIG. 14 is a block diagram of another IGBT drive circuit of the fifth embodiment of the present invention.

An IGBT drive circuit shown in FIG. 14 is a modification of the IGBT drive circuit described with reference to FIG. 12 and is constructed such that adjustment of the switching time of the gate resistor can be performed easily.

Reference numeral 12 represents a memory circuit with an arithmetic function, which stores an input voltage from a collector-to-emitter detecting circuit 10, and multiplies the input voltage by a correction coefficient and outputs it as a reference voltage to a comparator 7. The correction coefficient can be freely set from the outside, so that adjustment of the switching time of the gate resistor can be performed easily.

The memory circuit 12 with an arithmetic function may be either an analog circuit or a digital circuit.

Figure 15:
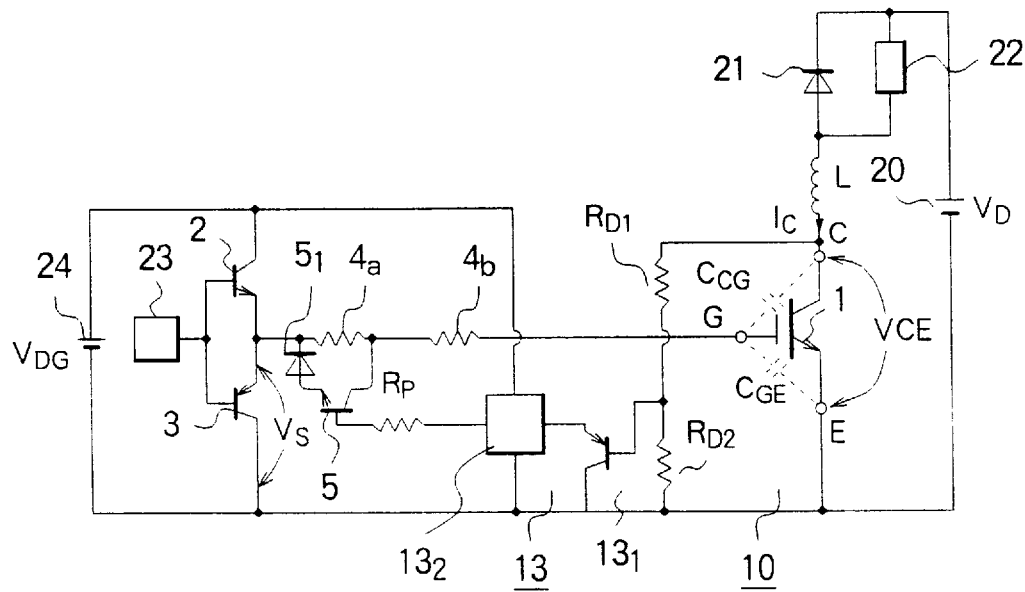
FIG. 15 is a block diagram of another IGBT drive circuit of the fifth embodiment of the present invention.

An IGBT drive circuit shown in FIG. 15 is a simplified form of the IGBT drive circuit described with respect to FIG. 10 and is constructed such that the detection of the switching time of the gate resistor and the switching of the gate resistor can be performed with simpler gate resistor switching means 13.

The gate resistor switching means 13 comprises a gate resistor switching-time detection switching element $13_1$ and a gate resistor switching drive circuit $13_2$. The voltage, detected by a collector-to-emitter voltage detecting circuit 10, causes the gate resistor switching-time detection switching element $13_1$ to drive a gate resistor switching element 5 through the gate resistor switching drive circuit $13_2$.

If the base-to-emitter voltage of the gate resistor switching-time detection switching element $13_1$ is $V_{BE\,(131)}$, the collector-to-emitter voltage $V_{CE}$ is expressed as follows.

$$V_{CE}=r_1 \cdot V_{BE(131)}/r_2+V_{BE\,(131)}$$

Even in this case, the switching time of the gate resistor can be arbitrarily selected by appropriately selecting the resistance values $r_1$ and $r_2$.

Figure 16:
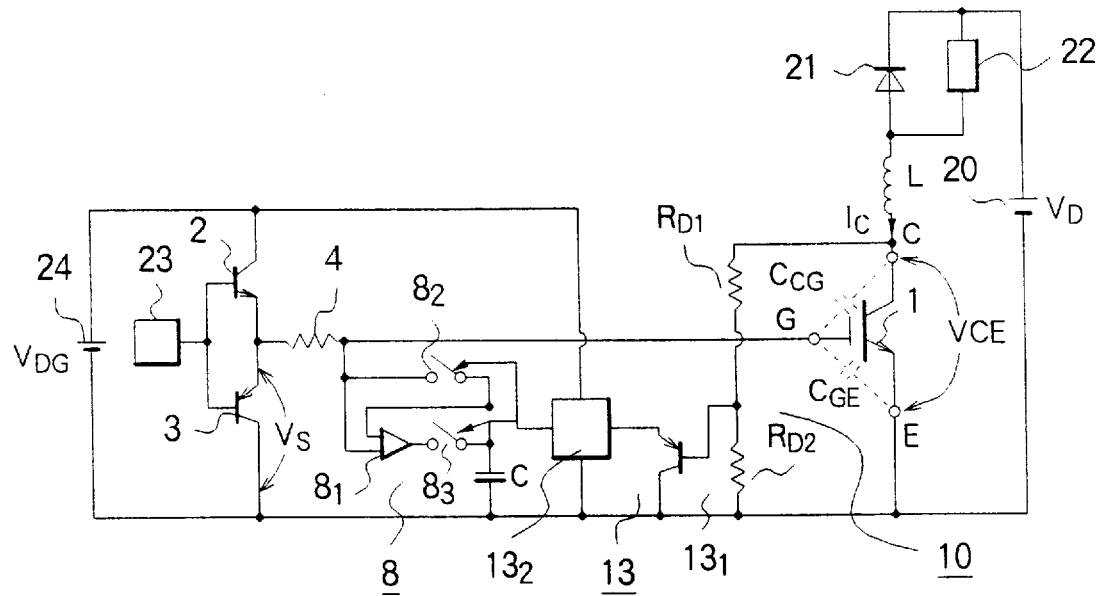
FIG. 16 is a block diagram of another IGBT drive circuit of the fifth embodiment of the present invention.

An IGBT drive circuit shown in FIG. 16 is constructed such that the detection of the gate circuit switching time of the IGBT drive circuit described with FIG. 4 is detected from the collector-to-emitter voltage detecting circuit.

Figure 17:
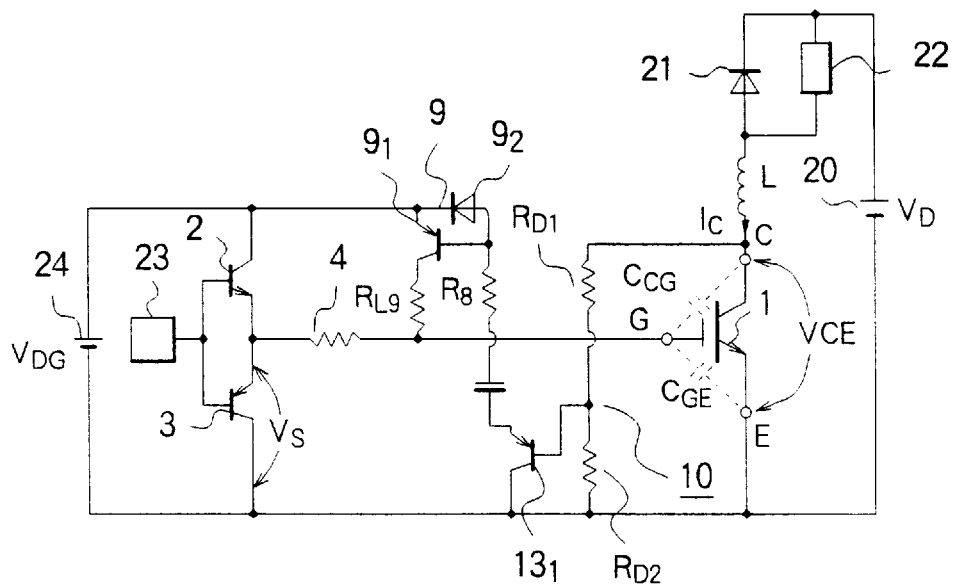
FIG. 17 is a block diagram of another IGBT drive circuit of the fifth embodiment of the present invention.
Figure 18:
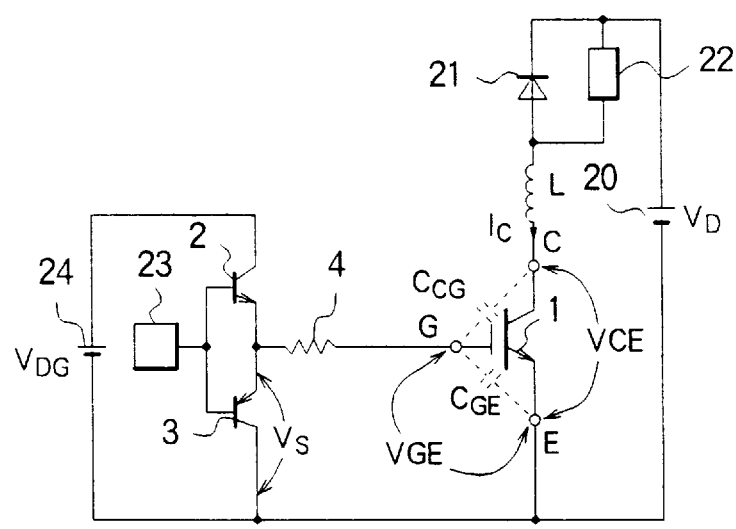
FIG. 18 is a block diagram of a conventional IGBT drive circuit.
Figure 19:
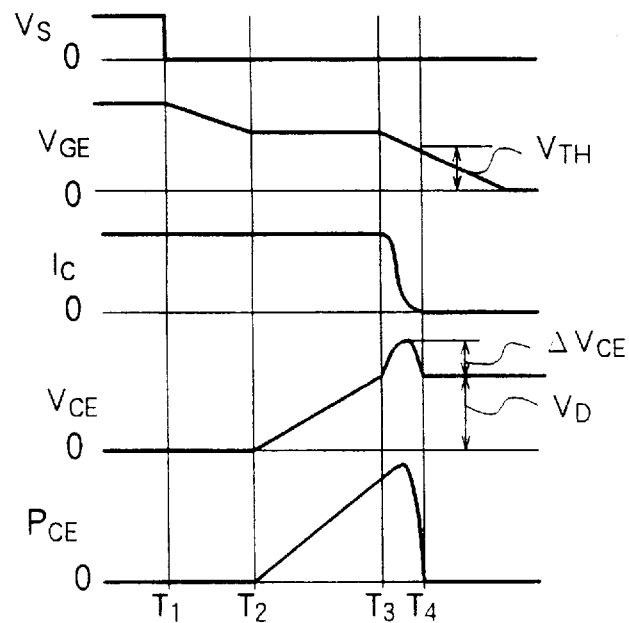
FIG. 19 is a voltage and current waveform diagram of each part in the conventional IGBT drive circuit.
Figure 20:
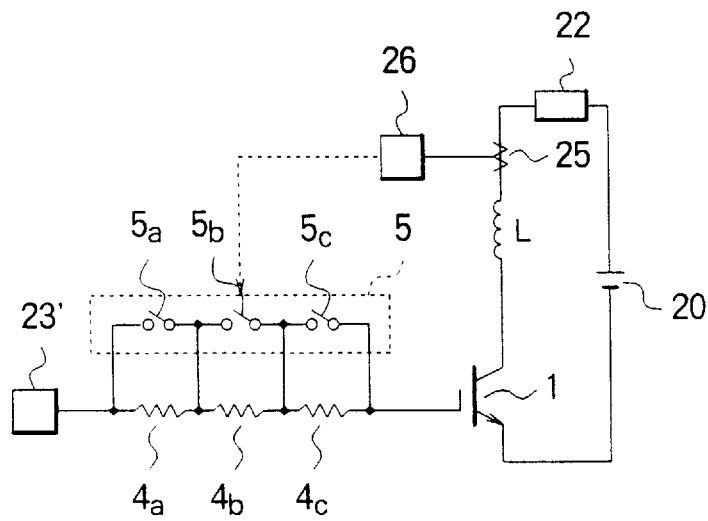
FIG. 20 is a block diagram of another conventional IGBT drive circuit.

Furthermore, an IGBT drive circuit shown in FIG. 17 is constructed such that the detection of the gate circuit switching time of the IGBT drive circuit described with reference to FIG. 5 is detected by the collector-to-emitter voltage detecting circuit.

The construction and operation of the IGBT drive circuits shown in FIGS. 16 and 17 can be easily understood from the foregoing description, so a description thereof is omitted.

While the invention has been described with reference to preferred embodiments thereof, it is to be understood that modifications or variations may be easily made without departing from the scope of this invention which is defined by the appended claims.

For example, the IGBT employed in each embodiment may comprise any type of an Insulated Gate Transistor, such as an Insulated Gate Field Effect Transistor or a Metal Oxide Semiconductor Field Effect Transistor.

What is claimed is:

1. An insulated gate transistor drive circuit comprising: operation-state detecting means including:
   a sensor for detecting a collector current of an insulated gate transistor and producing a first output signal indicative of the collector current;
   a differentiating circuit coupled to the sensor to produce a second output signal indicative of a rate of change of the collector current; and
operational parameter adjusting means coupled to the operation-state detecting means for adjusting an operational parameter of the insulated gate transistor after a source voltage applied to a gate of the insulated gate transistor is removed and the collector current of the insulated gate transistor is decreasing, in response to the second output signal.

2. The insulated gate transistor drive circuit as set forth in claim 1, wherein said operational parameter adjusting means comprises:
   a comparator having an input coupled to the differentiating circuit and a reference input coupled to a reference voltage, and producing a third output signal when the second output signal is less than the reference voltage and a fourth output signal when the second output signal is at least equal to the reference voltage;
   a resistor coupled in series with the gate of the insulated gate transistor; and
   a switching circuit coupled to the comparator and connected in parallel with the resistor, the switching circuit closing and short-circuiting the resistor in response to the third output signal and opening in response to the fourth output signal.

3. The insulated gate transistor drive circuit as set forth in claim 1, wherein the operational parameter adjusting means comprises:
   a gate-to-emitter capacitance switching circuit including:
       a comparator having a first input coupled to the gate of the insulated gate transistor and a second input;
       first and second switches coupled to the gate of the insulated gate transistor and to an output of the comparator, respectively, and actuated by the differentiating circuit;
   a capacitor coupled to the first and second switches, wherein the differentiating circuit controls the switches to connect the capacitor to the gate of the insulated gate transistor, in parallel with a gate-to-emitter capacitance of the insulated gate transistor, when the second output signal is greater than a threshold value, and to isolate the capacitor from the gate of the insulated gate transistor when the second output signal is less than the threshold value.

4. The insulated gate transistor drive circuit as set forth in claim 1, wherein:
   the operational parameter adjusting means comprises:
       a gate voltage control circuit including:
           a switching circuit coupled to the differentiating circuit;
           a resistor having a first resistance coupled in series between the switching circuit and the gate of the insulated gate transistor; and
           a power supply coupled to the switching circuit; and
   the insulated gate transistor drive circuit comprises a gate resistor having a second resistance coupled to the gate of the insulated gate transistor, the switching circuit conducting to apply a voltage from the power supply to the gate of the insulated gate transistor in response to the second output signal, the voltage being proportional to a ratio of the first resistance to the second resistance.

5. The insulated gate transistor drive circuit according to claim 1 wherein the differentiating circuit comprises a differential amplifier.

6. The insulated gate transistor drive circuit according to claim 1 wherein the differentiating circuit comprises an RC circuit.

7. The insulated gate transistor drive circuit according to claim 2 comprising first and second diodes connected in anti-parallel with each other between the sensor and the differentiating circuit.

8. An insulated gate transistor drive circuit comprising:

operation-state detecting means including:

means for detecting a collector-to-emitter voltage of an insulated gate transistor and providing a first output signal indicative of the collector-to-emitter voltage of the insulated gate transistor; and operational parameter adjusting means coupled to the means for detecting, for adjusting an operational parameter of the insulated gate transistor after a source voltage applied to a gate of the insulated gate transistor is removed and a collector current of the insulated gate transistor is decreasing, in response to the first output signal, said operational parameter adjusting means comprising:

a comparator coupled to the means for detecting and producing a second output signal when the first output signal is less than a reference voltage and a third output signal when the first output signal is greater than the reference voltage;

a resistor coupled in series with the gate of the insulated gate transistor; and a switching circuit coupled to the comparator and in parallel with the resistor, the switching circuit closing and short-circuiting the resistor in response to the second output signal and opening in response to the third output signal, wherein the reference voltage is a steady-state collector-to-emitter voltage in a cutoff state of the insulated gate transistor.

9. The insulated gate transistor drive circuit as set forth in claim 8, wherein the reference voltage is adjustable.

* * * * *